(12) United States Patent
Lee

(10) Patent No.: US 8,361,698 B2
(45) Date of Patent: Jan. 29, 2013

(54) METHOD OF FABRICATING PHOTO MASK FOR ORGANIC LIGHT EMITTING DISPLAY AND PHOTO MASK SO FABRICATED

(75) Inventor: Keun-Soo Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 272 days.

(21) Appl. No.: 12/801,306

(22) Filed: Jun. 2, 2010

(65) Prior Publication Data

US 2010/0310974 A1 Dec. 9, 2010

(30) Foreign Application Priority Data

Jun. 5, 2009 (KR) ........................ 10-2009-0049847

(51) Int. Cl.
*G03C 5/00* (2006.01)

(52) U.S. Cl. ......... 430/296; 430/313; 430/319; 430/942

(58) Field of Classification Search ................... 430/296, 430/313, 942, 319
See application file for complete search history.

(56) References Cited

U.S. PATENT DOCUMENTS

| | | | |
|---|---|---|---|
| 5,087,535 A | 2/1992 | Hirokane et al. | |
| 5,457,006 A | 10/1995 | Hirokane et al. | |
| 5,605,775 A | 2/1997 | Watanabe | |
| 5,750,290 A | 5/1998 | Yasuzato et al. | |
| 5,891,596 A | 4/1999 | Choi | |
| 5,914,204 A | 6/1999 | Lee | |
| 6,277,532 B1 | 8/2001 | Yahiro | |
| 6,555,275 B2 | 4/2003 | Yang | |
| 6,569,578 B2 | 5/2003 | Nozaki et al. | |
| 6,641,979 B2 | 11/2003 | Yang | |
| 2001/0019802 A1 | 9/2001 | Nozaki et al. | |
| 2002/0177049 A1 | 11/2002 | Iwasaki | |
| 2003/0180631 A1 | 9/2003 | Shiota et al. | |
| 2006/0147816 A1 | 7/2006 | Park | |
| 2006/0154157 A1 | 7/2006 | Hong | |
| 2007/0259276 A1 | 11/2007 | Yoshikawa et al. | |
| 2008/0090157 A1 | 4/2008 | Chung et al. | |
| 2008/0160430 A1 | 7/2008 | Jeong | |
| 2008/0280214 A1 | 11/2008 | Ryu | |

FOREIGN PATENT DOCUMENTS

| | | |
|---|---|---|
| KR | 20020018280 A | 3/2002 |
| KR | 20080046800 A | 5/2008 |
| KR | 10-2008-0061999 | 7/2008 |

OTHER PUBLICATIONS

Korean Office Action issued by KIPO, dated Jan. 31, 2011, corresponding to Korean Patent Application No. 10-2009-0049847, together with Request for Entry.

*Primary Examiner* — Christopher Young

(74) *Attorney, Agent, or Firm* — Robert E. Bushnell, Esq.

(57) ABSTRACT

A method of fabricating a photo mask for an organic light emitting display comprises forming a light shielding layer on a transparent substrate, coating the light shielding layer with an electron beam resist, performing exposure on the electron beam resist by a vector scan method in accordance with a specific pattern and using an electron beam having a predetermined accelerating voltage, developing the exposed electron beam resist to form an electron beam resist pattern having the specific pattern, and etching the light shielding layer using the electron beam resister pattern as an etching mask. The specific pattern has a shape corresponding to transistors included in a pixel of an organic light emitting display and elements that constitute a capacitor.

12 Claims, 2 Drawing Sheets

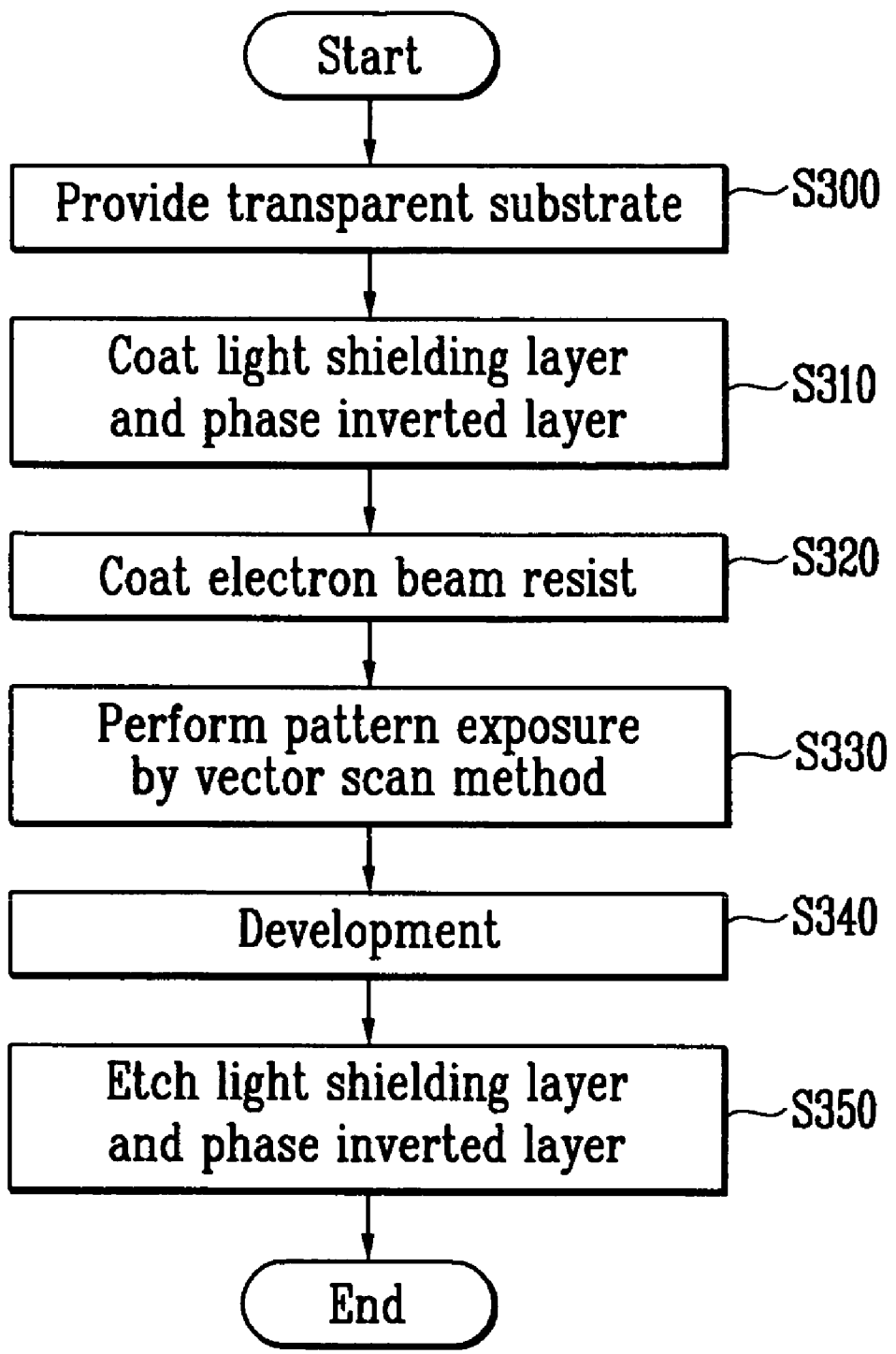

METHOD OF FABRICATING PHOTO MASK FOR ORGANIC LIGHT EMITTING DISPLAY AND PHOTO MASK SO FABRICATED

CLAIM OF PRIORITY

This application makes reference to, incorporates the same herein, and claims all benefits accruing under 35 U.S.C. §119 from an application earlier filed in the Korean Intellectual Property Office on the 5th of Jun. 2009 and there duly assigned Serial No. 10-2009-0049847.

BACKGROUND OF THE INVENTION

1. Field of the Invention

The present invention relates to a method of fabricating a photo mask for an organic light emitting display and, more particularly, to a method of fabricating a photo mask for an organic light emitting display so as to prevent deterioration of display quality, such as a horizontal line-shaped spot generated by the influence of critical dimension (CD) dispersion, and a photo mask so fabricated.

2. Description of the Related Art

Recently, flat panel displays (FPD) capable of reducing weight and volume of cathode ray tubes (CRT) so that they are made small and light are being spotlighted. The FPDs include a liquid crystal display (LCD), an organic light emitting display, a field emitter display (FED), and a plasma display panel (PDP).

Among the FPDs, the organic light emitting display has a wider range of usage temperature, is more resistant to shock or vibration, and has a larger view angle and higher response speed than the other FPDs so as to provide a clean moving picture, and thus the organic light emitting display is spotlighted as a next generation FPD.

The organic light emitting display is a display using a phenomenon in which electrons injected into an organic thin film through a negative electrode, and a negative electrode and holes, are recombined with each other to form exciton, and light of a specific wavelength is generated from the formed exciton. Since the organic light emitting display includes emission elements, an additional light source is not required, unlike in the LCD, and the brightness of organic light emitting diodes (OLED) which constitute the organic light emitting display is controlled by the amount of current that flows in the OLEDs.

To be specific, in the LCD, a desired data voltage is to be applied in a period where scan signals are applied in a voltage driving method. However, in the organic light emitting display, current that flows to the OLEDs of pixels is to be uniformly maintained so that the screen generated by a previous frame is displayed before the previous frame changes into a next frame.

That is, since the brightness of the organic light emitting display is controlled by the amount of current that flows to the OLEDs, precise deposition processes are required to be performed in forming the pixels.

The pixels of the organic light emitting display include various elements, such as a transistor and a capacitor, which are formed by a deposition process using a shadow mask or a fine metal mask (FMM).

In this case, due to the influence of the critical dimension (CD) dispersion generated when the deposition process is performed by the photo mask, a slight difference between the capacities of the capacitors of the pixels may be generated. For example, in the case of the capacitors formed on the scan lines in pixel regions, respectively, a horizontal line-shaped spot is generated in accordance with the CD dispersion generated when the electrodes of the capacitors are formed.

Due to the characteristics of the organic light emitting display, in order to reduce the influence of the CD dispersion of the photo mask used for processes of fabricating the organic light emitting display, a method of reducing the tolerance of the photo mask, that is, of precisely fabricating the photo mask, is required.

SUMMARY OF THE INVENTION

Accordingly, the present invention has been developed in order to provide a photo mask for an organic light emitting display and a method of fabricating same, wherein it is possible to minimize the critical dimension (CD) dispersion of the photo mask by fabricating the photo mask by a vector scan method using an electron beam so as to prevent the deterioration of display quality, such as the horizontal line-shaped spot, of the organic light emitting display.

In order to achieve the foregoing and/or other aspects of the present invention, according to an embodiment of the present invention, a method of fabricating a photo mask for an organic light emitting display comprises forming a light shielding layer on a transparent substrate, coating the light shielding layer with an electron beam resist, performing exposure by a vector scan method in accordance with a specific pattern on the electron beam resist using an electron beam having a predetermined accelerating voltage, developing the exposed electron beam resist so as to form an electron beam resist pattern having the specific pattern, and etching the light shielding layer using the electron beam resister pattern as an etching mask. The specific pattern has a shape corresponding to transistors included in a pixel of an organic light emitting display and elements that constitute a capacitor.

The pixel of the organic light emitting display includes six transistors and two capacitors. The specific pattern has a shape corresponding to the pattern of the top electrode or the bottom electrode of a boosting capacitor provided in the pixel of the organic light emitting display.

The accelerating voltage of the electron beam is no less than 50 keV.

According to the present invention, the photo mask for the organic light emitting display is fabricated by the vector scan method using the electron beam to minimize the CD dispersion of the mask and to prevent the deterioration of the display quality, such as the horizontal line-shaped spot, of the organic light emitting display.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIG. 3 is a flowchart illustrating a method of fabricating a photo mask for an organic light emitting display according to an embodiment of the present invention.

DETAILED DESCRIPTION OF THE INVENTION

Figure 1:
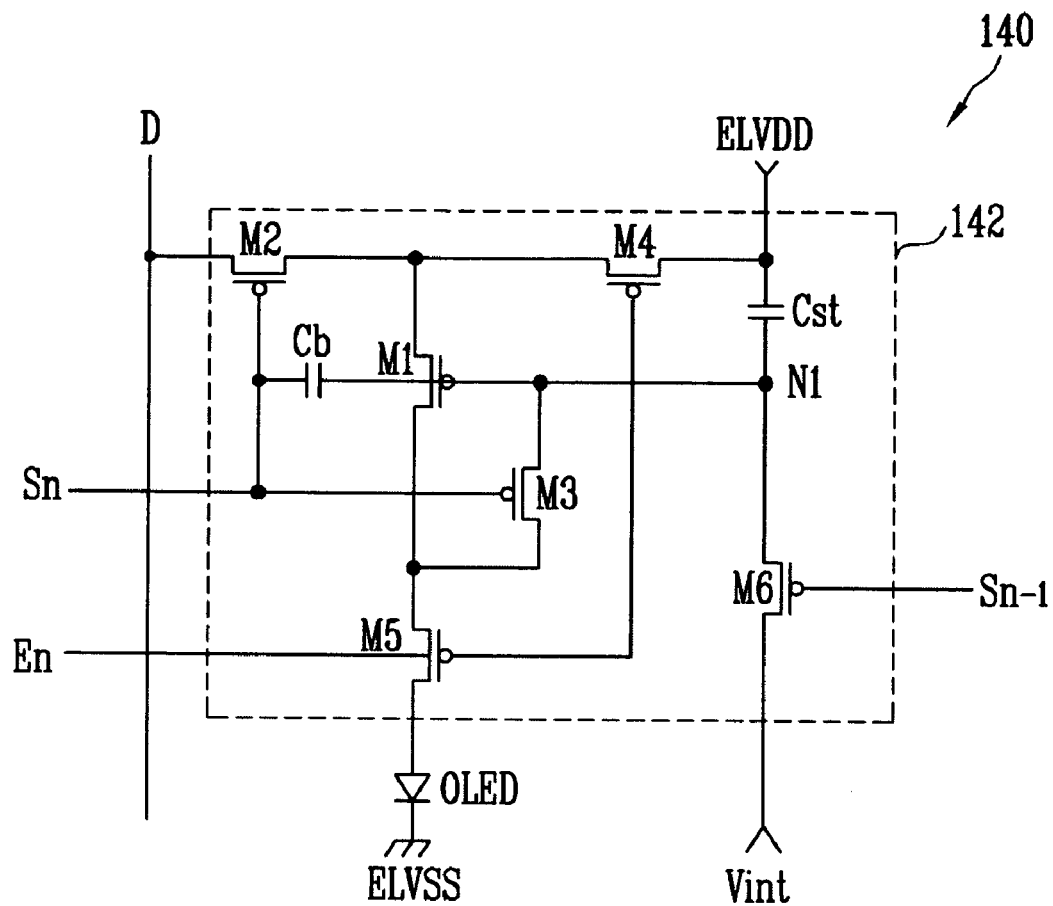
FIG. 1 is a circuit diagram of a pixel of an organic light emitting display constructed according to an embodiment of the present invention.

In the following detailed description, only certain exemplary embodiments of the present invention have been shown and described, simply by way of illustration. As those skilled in the art will realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the other element or be indirectly on the other element with one or more intervening elements interposed therebetween. Also, when an element is referred to as being "connected to" another element, it can be directly connected to the other element or be indirectly connected to the other element with one or more intervening elements interposed therebetween. Hereinafter, like reference numerals refer to like elements.

The embodiment of the present invention will be described in detail below with reference to the accompanying drawings.

Before describing the embodiment of the present invention, the necessity of minimizing critical dimension (CD) dispersion with respect to a photo mask for an organic light emitting display in fabricating an organic light emitting display will be described by referring to a circuit diagram of the pixels of the organic light emitting display and the sectional view of the capacitors included in the pixels.

FIG. 1 is a circuit diagram of a pixel of an organic light emitting display constructed according to an embodiment of the present invention.

The pixel circuit illustrated in FIG. 1 is only an embodiment, and the pixel circuit formed by the photo mask for the organic light emitting display according to the present invention is not limited to the pixel circuit of FIG. 1.

Referring to FIG. 1, the pixel 140 according to the embodiment of the present invention includes a pixel circuit 142 coupled to an organic light emitting diode (OLED), a data line D, a scan line Sn, and an emission control line En to control the OLED.

The anode electrode of the OLED is coupled to the pixel circuit 142 and the cathode electrode of the OLED is coupled to a second power source ELVSS. The second power source ELVSS is set to have a voltage lower than the voltage of a first power source ELVDD. The OLED generates one light component among red, green, and blue light components so as to correspond to the amount of current supplied from the pixel circuit 142.

The pixel circuit 142 includes a storage capacitor Cst and a sixth transistor M6 coupled between the first power source ELVDD and an initialization power source Vint, a fourth transistor M4 coupled between the first power source ELVDD and the OLED, a first transistor M1, a fifth transistor M5, a third transistor M3 coupled between the gate electrode and the second electrode of the first transistor M1, and a boosting capacitor Cb coupled between the gate electrode of the first transistor M1 and the gate electrode of the second transistor M2.

Here, the first electrode is set as a drain electrode or a source electrode, and the second electrode is set as an electrode different from the first electrode. For example, when the first electrode is set as the source electrode, the second electrode is set as the drain electrode. In FIG. 1, the first to sixth transistors M1 to M6 are p-type metal oxide semiconductor field effect transistors (MOSFET). However, the present invention is not limited to the above. When the first to sixth transistors M1 to M6 are formed of n-type MOSFETs, as is well known to those skilled in the art, the polarities of driving waveforms are inverted.

The first electrode of the first transistor M1 is coupled to the first power source ELVDD via the fourth transistor M4 and the second electrode of the first transistor M1 is coupled to the OLED via the fifth transistor M5. The gate electrode of the first transistor M1 is coupled to a first node N1. The first transistor M1 supplies, to the OLED, a current corresponding to the voltage charged in the storage capacitor Cst, that is, the voltage applied to the first node N1.

The first electrode of the third transistor M3 is coupled to the second electrode of the first transistor M1 and the second electrode of the third transistor M3 is coupled to the gate electrode of the first transistor M1. The gate electrode of the third transistor M3 is coupled to the nth scan line Sn. The third transistor M3 is turned on when a scan signal is supplied to the nth scan line Sn so as to couple the first transistor M1 in the form of a diode. That is, when the third transistor M3 is turned on, the first transistor M1 is coupled in the form of a diode.

The first electrode of the second transistor M2 is coupled to the data line D and the second electrode of the second transistor M2 is coupled to the first electrode of the first transistor M1. The gate electrode of the second transistor M2 is coupled to the nth scan line Sn. The second transistor M2 is turned on when the scan signal is supplied to the nth scan line Sn so as to supply the data signal supplied to the data line D to the first electrode of the first transistor M1.

The first electrode of the fourth transistor M4 is coupled to the first power source ELVDD and the second electrode of the fourth transistor M4 is coupled to the first electrode of the first transistor M1. The gate electrode of the fourth transistor M4 is coupled to the emission control line En via the fifth transistor M5. The fourth transistor M4 is turned on when an emission control signal is not supplied (that is, when a low emission control signal is supplied) so as to electrically couple the first power source ELVDD and the first transistor M1 to each other.

The first electrode of the fifth transistor M5 is coupled to the first transistor M1 and the second electrode of the fifth transistor M5 is coupled to the OLED. The gate electrode of the fifth transistor M5 is coupled to the emission control line En. The fifth transistor M5 is turned on when the emission control signal is not supplied (that is, when the low emission control signal is supplied) so as to electrically couple the first transistor M1 and the OLED to each other.

The first electrode of the sixth transistor M6 is coupled to the storage capacitor Cst and to the gate electrode of the first transistor M1 (that is, the first node N1). The second electrode of the sixth transistor M6 is coupled to the initialization power source Vint. The gate electrode of the sixth transistor M6 is coupled to a (n−1)th scan line Sn−1. The sixth transistor M6 is turned on when a scan signal is supplied to the (n−1)th scan line Sn−1 so as to initialize the first node N1. Therefore, the voltage value of the initialization power source Vint is set to be lower than the voltage value of the data signal.

The storage capacitor Cst is coupled between the first power source ELVDD and the first node N1 so that a voltage corresponding to the data signal input to each of the pixels is stored.

In addition, the boosting capacitor Cb is coupled between the first node N1 (via the first transistor M1) and the nth scan line Sn. The boosting capacitor Cb is provided in order to prevent a voltage lower than the voltage desired by the data signal stored in the storage capacitor Cst from being charged so that low gray scales are not correctly displayed. The boosting capacitor Cb increases the voltage of the first node N1 when the supply of the scan signal is stopped so as to solve the above-described problem.

Figure 2:
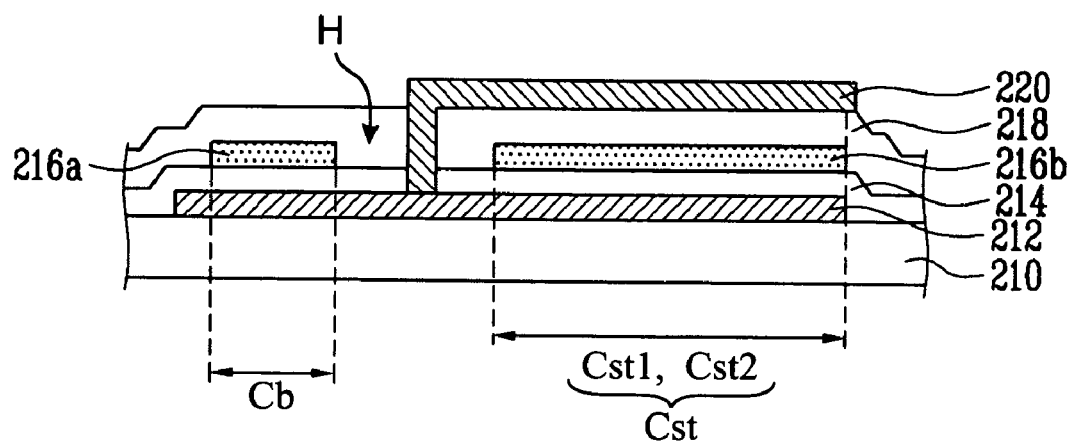
FIG. 2 is a sectional view illustrating a capacitor formed in the pixel of FIG. 1.

FIG. 2 is a sectional view illustrating a capacitor formed in the pixel of FIG. 1. In FIG. 2, for convenience sake, only the capacitor is illustrated. However, a plurality of transistors are actually formed in each of the pixels.

Referring to FIG. 2, a semiconductor 212 formed on a substrate 210 to constitute capacitors Cb and Cst, a first electrode layer 216a, a second electrode layer 216b, and a third electrode layer 220 are provided in the pixel according to the present invention. That is, at least one of the capacitors Cb and Cst may be provided in the form of a dual capacitor so that enough capacity can be secured.

In addition, a first insulating layer 214 and a second insulating layer 218 are provided in each of the pixels so that the semiconductor layer 212, the first electrode layer 216a, the second electrode layer 216b, and the third electrode layer 220 can be insulated from each other.

First, the semiconductor layer 212 is formed on substrate 210. The semiconductor layer 212 is made of the same material as the channels of the transistors. The semiconductor layer 212 is formed at the same time as the channels of the transistors and serves as the bottom electrode of the capacitor. The semiconductor layer 212 may be formed of poly-silicon.

After the semiconductor layer 212 is formed on the substrate 210, the first insulating layer 214 is formed on the semiconductor layer 212. The first insulating layer 214 electrically insulates the first electrode layer 216a, the second electrode layer 216b, and the semiconductor layer 212, which are formed hereinafter, from each other.

Then, at the moment when the second electrode layer 216b is formed in the region where the storage capacitor Cst is formed, the first electrode layer 216a is formed in the region where the boosting capacitor Cb is formed. In this case, the length of the second electrode layer 216b is set to be larger than the length of the first electrode layer 216a so that the capacity of the storage capacitor Cst can be set to be larger than the capacity of the boosting capacitor Cb. On the other hand, the first electrode layer 216a and the second electrode layer 216b are formed of the same material and at the same time as the gate electrodes and the scan lines of the transistors.

In particular, as illustrated in FIGS. 1 and 2, the first electrode layer 216a (capacitor Cb) is coupled to the scan line. That is, for the scan lines arranged in a row direction, in each of the pixels coupled to the scan lines, the first electrode layer 216a protrudes above the scan line.

After the first electrode layer 216a and the second electrode layer 216b are formed, the second insulating layer 218 is formed so as to cover the first electrode layer 216a and the second electrode layer 216b. The second insulating layer 218 electrically insulates the first electrode layer 216a and the second electrode layer 216b from the third electrode layer 220 which is formed after the first electrode layer 216a and the second electrode layer 216b.

After the second insulating layer 218 is formed, a contact hole H is formed between the first electrode layer 216a and the second electrode layer 216b so that the semiconductor layer 212 is exposed. The third electrode layer 220 is formed so as to be coupled to the semiconductor layer 212 through the contact hole H.

Here, the third electrode layer 220 is formed to realize the dual capacitor in the position where the third electrode layer 220 overlaps the second electrode layer 216b as illustrated in the drawing so that the capacity of the storage capacitor Cst can be larger than the capacity of the boosting capacitor Cb.

As described above, when the third electrode layer 220 is formed, the storage capacitor Cst and the boosting capacitor Cb are completed.

That is, the boosting capacitor Cb is formed in the region where the semiconductor layer 212 and the first electrode layer 216a overlap each other. The storage capacitor Cst is formed in the region where the semiconductor layer 212 and the second electrode layer 216b overlap each other and in the region where the second electrode layer 216b and the third electrode layer 220 overlap each other.

In the case of the pixel illustrated in FIGS. 1 and 2, the top electrode 216a of the boosting capacitor Cb is coupled to the scan line. Therefore, in a process of forming the top or bottom electrode of the boosting capacitor Cb, a horizontal line-shaped spot may be generated in each of the scan lines due to CD dispersion.

That is, the overlap area of the top electrode and the bottom electrode, which determines the capacity of the boosting capacitor, can vary due to CD dispersion. In this case, the capacity of the boosting capacitor varies so that the horizontal line-shaped spot can be displayed.

In the organic light emitting display, as illustrated in FIG. 1, the structure of the pixel circuit is considerably complicated so that the width of the patterns formed on the substrate and the distance between the patterns are considerably fine. In addition, since the brightness of the organic light emitting display is controlled by the amount of current that flows to the OLED included in each of the pixels, a precise deposition process is required for forming the pixel.

According to the embodiment of the present invention, in order to solve such a problem, a method of fabricating the photo mask with minimization of CD dispersion of the photo mask used for forming the electrode of the boosting capacitor Cb is provided.

That is, according to the embodiment of the present invention, the photo mask is fabricated by a vector scan method using an electron beam to precisely perform the deposition process of the organic light emitting display, and to prevent the display quality of the organic light emitting display from deteriorating.

FIG. 3 is a flowchart illustrating a method of fabricating a photo mask for an organic light emitting display according to an embodiment of the present invention.

Referring to FIG. 3, a transparent substrate is provided as the substrate of the photo mask (S300). Glass or quartz is mainly used for the transparent substrate.

A light shielding layer is formed on the transparent substrate. Chrome is mainly used for the light shielding layer (S310). If necessary, in order to fabricate a phase inverted mask, a phase inverted layer made of MoSiON can be formed on or under the light shielding layer instead of forming the light shielding layer alone (S310).

The light shielding layer and/or the phase inverted layer can be deposited by sputtering or chemical vapor deposition.

Then, the light shielding layer is coated with electron beam resist (S320).

The electron beam resist can be a negative type electron beam resist or a positive type electron beam resist. In the positive type electron beam resist, an exposed part is developed and removed in a subsequent developing process. In the negative type electron beam resist, an exposed part resides to form a pattern.

According to the embodiment of the present invention, the pattern has a shape corresponding to the transistors provided in each of the pixels of the organic light emitting display and the elements that constitute the capacitor.

For example, as illustrated in FIGS. 1 and 2, the pattern of the electron beam resist is formed so as to correspond to the pattern of the top and/or bottom electrode of the boosting capacitor Cb provided in each of the pixels.

Then, referring to FIG. 3, the photo mask coated with the electron beam resist is exposed (S330).

According to the embodiment of the present invention, in performing an exposing process, exposure is performed in accordance with the pattern of a predetermined material layer (for example, the light shielding layer) to be formed in a subsequent etching process by the electron beam of a high accelerating voltage. At this point, the accelerating voltage of the electron beam is preferably no less than 50 keV.

A scattering range in which the electron beam of the high accelerating voltage is scattered around the region onto which the electron beam is radiated is small so that a pattern of high resolution can be obtained.

That is, according to the embodiment of the present invention, exposure is performed by a vector scan method. Therefore, a precise photo mask pattern can be formed so that the CD dispersion of the photo mask can be minimized.

Then, the exposed electron beam resist is developed by a developing solution to form the electron beam resist pattern (S340).

The light shielding layer and/or the phase inverted layer under the electron beam resist is then etched using the electron beam resist pattern as an etching mask so as to fabricate the photo mask (S350).

Here, the developing process and the etching process vary in accordance with the materials of the electron beam resist, the light shielding layer and/or the phase inverted layer, which is well known to those skilled in the art. Therefore, description thereof will not be presented.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A method of fabricating an organic light emitting display, comprising the steps of:
    forming a light shielding layer on a transparent substrate;
    coating the light shielding layer with electron beam resist;
    performing exposure on the electron beam resist by a vector scan method in accordance with a specific pattern and using an electron beam having a predetermined accelerating voltage;
    developing the exposed electron beam resist to form an electron beam resist pattern having the specific pattern;
    etching the light shielding layer using the electron beam resist pattern as an etching mask; and
    forming the specific pattern to have a shape corresponding to transistors included in a pixel of an organic light emitting display and elements which constitute a capacitor.

2. The method as claimed in claim 1, comprised of the pixel of the organic light emitting display including six transistors and two capacitors.

3. The method as claimed in claim 1, comprised of forming the specific pattern to have a shape corresponding to a pattern of one of a top electrode and a bottom electrode of a boosting capacitor provided in the pixel of the organic light emitting display.

4. The method as claimed in claim 1, comprising the predetermined accelerating voltage of the electron beam being no less than 50keV.

5. In a method of fabricating an organic light emitting display, which includes providing pixels which include at least one transistor and at least one capacitor formed by a deposition process using a photo mask, a method of fabricating the photo mask, comprising the steps of:
    forming a light shielding layer on a transparent substrate;
    coating the light shielding layer with an electron beam resist;
    performing exposure on the electron beam resist by a vector scan method in accordance with a specific pattern and using an electron beam having a predetermined accelerating voltage;
    developing the exposed electron beam resist to form an electron beam resist pattern having the specific pattern; and
    etching the light shielding layer using the electron beam resist pattern as an etching mask,
    wherein the specific pattern has a shape corresponding to transistors included in a pixel of an organic light emitting display and elements which constitute a capacitor;
    whereby adverse influence of critical dimension (CD) dispersion generated when the deposition process is performed using the photo mask is eliminated.

6. In the method as recited in claim 5, wherein the pixel of the organic light emitting display includes six transistors and two capacitors.

7. In the method as recited in claim 5, wherein the specific pattern has a shape corresponding to a pattern of one of a top electrode and a bottom electrode of a boosting capacitor provided in the pixel of the organic light emitting display.

8. In the method as recited in claim 7, wherein the predetermined accelerating voltage of the electron beam is no less than 50keV.

9. In the method as recited in claim 6, wherein the predetermined accelerating voltage of the electron beam is no less than 50keV.

10. In the method as recited in claim 5, wherein the specific pattern has a shape corresponding to a pattern of one of a top electrode and a bottom electrode of a boosting capacitor provided in the pixel of the organic light emitting display.

11. In the method as recited in claim 10, wherein the predetermined accelerating voltage of the electron beam is no less than 50keV.

12. In the method as recited in claim 5, wherein the predetermined accelerating voltage of the electron beam is no less than 50keV.

* * * * *